United States Patent
Jeong

(10) Patent No.: US 7,902,916 B2
(45) Date of Patent: Mar. 8, 2011

(54) SWITCHED CAPACITOR RESONATOR AND SIGMA-DELTA MODULATOR USING THE SAME

(75) Inventor: Chan Yong Jeong, Seoul (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 71 days.

(21) Appl. No.: 12/254,429

(22) Filed: Oct. 20, 2008

(65) Prior Publication Data

US 2009/0146735 A1    Jun. 11, 2009

(30) Foreign Application Priority Data

Dec. 11, 2007   (KR) .......................... 10-2007-0128012

(51) Int. Cl.
*H03B 1/00* (2006.01)
*H03K 5/00* (2006.01)
*H04B 1/10* (2006.01)

(52) U.S. Cl. ......................................................... 327/554
(58) Field of Classification Search .................... 327/554
See application file for complete search history.

(56) References Cited

U.S. PATENT DOCUMENTS 5,442,353 A   8/1995   Jackson
5,982,315 A   11/1999  Bazarjani et al.

FOREIGN PATENT DOCUMENTS

KR    2003-0045073 A    6/2003

*Primary Examiner* — Lincoln Donovan
*Assistant Examiner* — Daniel Rojas
(74) *Attorney, Agent, or Firm* — Lowe Hauptman Ham & Berner LLP

(57) ABSTRACT

Provided is a switched capacitor resonator including at least one integrator circuit having a differential operational amplifier and a sub feedback circuit configured with a switched capacitor circuit. A main feedback circuit connecting main input and output terminals of the switched capacitor resonator to each other may be configured with the switched capacitor circuit. The main feedback circuit may be connected to the sub feedback circuit included in one of the integrator circuits. A capacitor of the main feedback circuit can serve as an integration capacitor connected between the input and output terminals of the differential operational amplifier. Consequently, it is possible to improve an operating speed by reducing a settling time constant of the integrator circuit.

8 Claims, 8 Drawing Sheets

SWITCHED CAPACITOR RESONATOR AND SIGMA-DELTA MODULATOR USING THE SAME

CROSS-REFERENCE TO RELATED APPLICATIONS

This application claims the priority of Korean Patent Application No. 2007-128012 filed on Dec. 11, 2007 in the Korean Intellectual Property Office, the disclosure of which is incorporated herein by reference.

BACKGROUND OF THE INVENTION

1. Field of the Invention

The present invention relates to a switched capacitor resonator and a sigma-delta modulator using the same, and more particularly, to a switched capacitor resonator designed to operate at high speed by reducing a settling time constant of an integrator in the switched capacitor resonator having the integrator configured with an operational amplifier, and a sigma-delta modulator using the switched capacitor resonator.

2. Description of the Related Art

Recently, in line with rapid development of wireless communication technology, studies are being conducted on a variety of new communication systems and circuits, and there is also an ongoing demand for a fusion type communication system architecture incorporating a traditional wireless communication system and a new wireless communication system. To realize such a fusion type communication system architecture, it is essentially required to digitalize a wireless communication system. For this reason, it is being considered that a digital-to-analog converter (ADC) becomes more and more important in digitalization.

The ADC is an important circuitry configured to convert an analog signal to a digital signal. Examples of the ADC may typically include a flash ADC, a pipeline ADC, a successive approximation (SAR) ADC, and a sigma-delta ADC. In particular, the sigma-delta ADC is advantageous in realizing a high-performance ADC in virtue of its excellent noise-shaping characteristic using over-sampling technique.

Since the sigma-delta ADC has a circuit configuration based on an operational amplifier, it is difficult to be applied to high-speed applications and thus has been limitedly used in only an audio field so far. Through continuing studies on a high-speed sigma-delta modulator, the sigma-delta ADC is being widely used in a wireless communication field as well. The sigma-delta ADC mainly includes a sigma-delta modulator and a digital filter (quantizer). Especially, the sigma-delta modulator is applied to a power amplifier (PA) or a phase lock loop (PLL) circuitry requiring high noise-shaping characteristic.

In general, the sigma-delta modulator may be classified into a lowpass type and a bandpass type, and each type may be divided into a discrete-time structure and a continuous-time structure. Each type has a tradeoff relation therebetween, and is selectively used according to application fields. The discrete-time bandpass sigma-delta modulator may use an external resonator or may be configured based on a switched capacitor resonator in a circuit. The switched capacitor resonator may include a plurality of integrators having an operational amplifier, and integration capacitors and sampling capacitors connected to the operational amplifier through a switch.

Generally, a sigma-delta modulator having a switched capacitor resonator has a limitation in that it is difficult to be used in application fields requiring high-speed performance due to a slow settling time. Therefore, in order for the sigma-delta modulator having the switched capacitor resonator to be applied to a system requiring high-speed performance, it is compulsory to reduce the settling time constant of the integrator based on characteristics of the operational amplifier. Hence, this necessitates the development of a switched capacitor resonator that can reduce the settling time constant to secure high-speed performance of the sigma-delta modulator having the switched capacitor resonator.

SUMMARY OF THE INVENTION

An aspect of the present invention provides a switched capacitor resonator having a circuit configuration operating at high speed by reducing a settling time constant of an integrator in the switched capacitor resonator having the integrator configured with an operational amplifier, and a sigma-delta modulator using the switched capacitor resonator.

According to an aspect of the present invention, there is provided a switched capacitor resonator, including: a main input terminal through which an analog differential signal is input, and a main output terminal through which an analog differential signal is output; a first signal input circuit connected to the main input terminal, and having a switched capacitor circuit configuration configured with a capacitor and two kinds of switches opened/shorted by switching clocks having a phase different of 180° therebetween; a first integrator circuit including a first differential operational amplifier (DOA) having an input terminal connected to the first signal input circuit, and a first sub feedback circuit having the switched capacitor circuit configuration, the first sub feedback circuit being connected between input and output terminals of the first DOA; a second signal input circuit connected to the output terminal of the first DOA, and having the switched capacitor circuit configuration; a second integrator circuit including a second DOA having an input terminal connected to the second signal input circuit and an output terminal connected to the main output terminal, and a second sub feedback circuit having the switched capacitor circuit configuration, the second sub feedback circuit being connected between input and output terminals of the second DOA; and a main feedback circuit connected between the first signal input circuit and the main output terminal, and having the switched capacitor circuit configuration. Herein, the main feedback circuit is connected to the switched capacitor circuit configuration of the second sub feedback circuit so that a capacitor of the main feedback circuit serves as an integration capacitor connected between the input and output terminals of the second DOA according to whether switches are shorted or opened.

The main input terminal may include first and second main input terminals through which two signals composing the analog differential signal are input, respectively.

The first signal input circuit may include: a first switched capacitor circuit including a first switch having one end connected to the first main input terminal, a first capacitor having an one end connected to the other end of the first switch, a second switch having one end connected to the other end of the first capacitor and the other end connected to an inverting input terminal of the first DOA, a third switch connected between a ground and a connection node between the first capacitor and the second switch, and a fourth switch connected between the ground and a connection node between the first switch and the first capacitor; and a second switched capacitor circuit including a fifth switch having one end connected to the second main input terminal, a second capacitor having an one end connected to the other end of the fifth switch, a sixth switch having one end connected to the other end of the second capacitor and the other end connected to a non-inverting input terminal of the first DOA, a seventh switch connected between the ground and a connection node between the second capacitor and the sixth switch, and an eighth switch connected between the ground and a connection node between the fifth switch and the second capacitor. Herein, the first, third, fifth, and seventh switches may be shorted/opened by a first switching clock, and the second, fourth, sixth and eighth switches may be shorted/opened by a second switching clock having a phase difference of 180° from the first switching clock.

The first sub feedback circuit may include: a third switched capacitor circuit including a ninth switch having one end connected to the inverting input terminal of the first DOA, a third capacitor having one end connected to the other end of the ninth switch, a tenth switch having one end connected to the other end of the third capacitor and the other end connected to a non-inverting output terminal of the first differential amplifier, an eleventh switch connected between the ground and a connection node between the third capacitor and the ninth switch, a twelfth switch connected between the ground and a connection node between the third capacitor and the tenth switch, a fourth capacitor having one end connected to the inverting input terminal of the first DOA, a thirteenth switch connected between the other end of the fourth capacitor and the non-inverting output terminal of the first DOA, and a fourteenth switch connected between the ground and a connection node between the fourth capacitor and the thirteenth switch; and a fourth switched capacitor circuit including a fifteenth switch having one end connected to the non-inverting input terminal of the first DOA, a fifth capacitor having one end connected to the other end of the fifteenth switch, a sixteenth switch having one end connected to the other end of the fifth capacitor and the other end connected to an inverting output terminal of the first differential amplifier, a seventeenth switch connected between the ground and a connection node between the fifteenth switch and the fifth capacitor, an eighteenth switch connected between the ground and a connection node between the fifth capacitor and the sixteenth switch, a sixth capacitor having one end connected to the non-inverting input terminal of the first DOA, a nineteenth switch connected between the other end of the sixth capacitor and the inverting output terminal of the first DOA, and a twentieth switch connected between the ground and a connection node between the sixth capacitor and the nineteenth switch. Herein, the ninth, tenth, fourteenth, fifteenth, sixteenth and twentieth switches may be shorted/opened by the first switching clock, and the eleventh, twelfth, thirteenth, seventeenth, eighteenth and nineteenth switches may be shorted/opened by the second switching clock.

The second signal input circuit may include: a fifth switched capacitor circuit including a twenty-first switch having one end connected to the non-inverting output terminal of the first DOA, a seventh capacitor having one end connected to the other end of the twenty-first switch, a twenty-second switch having one end connected to the other end of the seventh capacitor and the other end connected to an inverting input terminal of the second differential amplifier, a twenty-third switch connected between the ground and a connection node between the seventh capacitor and the twenty-second switch, and a twenty-fourth switch connected between the ground and a connection node between the seventh capacitor and the twenty-first switch; and a sixth switched capacitor circuit including a twenty-fifth switch having one end connected to the inverting output terminal of the first DOA, an eighth capacitor having one end connected to the other end of the twenty-fifth switch, a twenty-sixth switch having one end connected to the other end of the eighth capacitor and the other end connected to a non-inverting input terminal of the second differential amplifier, a twenty-seventh switch connected between the ground and a connection node between the eighth capacitor and the twenty-sixth switch, and a twenty-eighth switch connected between the ground and a connection node between the eighth capacitor and the twenty-fifth switch. Herein, the twenty-first, twenty-third, twenty-fifth and twenty-seventh switches may be shorted/opened by the first switching clock, and the twenty-second, twenty-fourth, twenty-sixth and twenty-eighth switches may be shorted/opened by the second switching clock.

The second sub feedback circuit may include: a seventh switched capacitor circuit including a twenty ninth switch having one end connected to the inverting input terminal of the second DOA, a ninth capacitor having one end connected to the other end of the twenty ninth switch, a thirtieth switch having one end connected to the other end of the ninth capacitor and the other end connected to a non-inverting output terminal of the second differential amplifier, a thirty-first switch connected between the ground and a connection node between the ninth capacitor and the thirtieth switch, a tenth capacitor having one end connected to the inverting input terminal of the second DOA, a thirty-second switch connected between the other end of the tenth capacitor and the non-inverting output terminal of the second DOA, and a thirty-third switch connected between the ground and a connection node between the tenth capacitor and the thirty-second switch; and an eighth switched capacitor circuit including a thirty-fourth switch having one end connected to the non-inverting input terminal of the second DOA, an eleventh capacitor having one end connected to the other end of the thirty-fourth switch, a thirty-fifth switch having one end connected to the other end of the eleventh capacitor and the other end connected to an inverting output terminal of the second differential amplifier, a thirty-sixth switch connected between the ground and a connection node between the thirty-fifth switch and the eleventh capacitor, a twelfth capacitor having one end connected to the non-inverting input terminal of the second DOA, a thirty-seventh switch connected between the other end of the twelfth capacitor and the inverting output terminal of the second DOA, and a thirty-eighth switch connected between the ground and a connection node between the twelfth capacitor and the thirty-seventh switch. Herein, the twenty ninth, thirtieth, thirty-third, thirty-fourth, thirty-fifth and thirty-eighth switches may be shorted/opened by the first switching clock, and the thirty-first, thirty-second, thirty-sixth and thirty-seventh switches may be shorted/opened by the second switching clock.

The main feedback circuit may include: a ninth switched capacitor including a thirty-ninth switch having one end connected to a connection node between the first capacitor and the second switch, a thirteenth capacitor having one end connected to the other end of the thirty-ninth switch, a fortieth switch connected between the other end of the thirteenth capacitor and the ground, and a forty-first switch connected between the inverting output terminal of the second DOA and a connection node between the thirteenth capacitor and the fortieth switch, a connection node between the thirty-ninth switch and the thirteenth capacitor being connected to a connection node between the eleventh capacitor and the thirty-fourth switch; and a tenth switched capacitor including a forty-second switch having one end connected to a connection node between the second capacitor and the sixth switch, a fourteenth capacitor having one end connected to the other end of the forty-second switch, a forty-third switch connected between the other end of the fourteenth capacitor and the ground, and a forty-fourth switch connected between the non-inverting output terminal of the second DOA and a connection node between the fourteenth capacitor and the forty-third switch, a connection node between the forty-second switch and the fourteenth capacitor being connected to a connection node between the ninth capacitor and the twenty ninth switch. Herein, the forty-first and forty-fourth switches may be shorted/opened by the first switching clock, and the thirty-ninth, fortieth, forty-second and forty-third switches may be shorted/opened by the second switching clock.

The first to ninth, eleventh, thirteenth and fourteenth capacitors may have the same capacitance, and the tenth and twelfth capacitors have twice the capacitance of the first capacitor.

According to an aspect of the present invention, there is provided a sigma-delta modulator including at least one switched capacitor resonator described above.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. In the following description, well-known functions or constructions are not described in detail because they would obscure the invention in unnecessary detail. Also, the terms used herein are defined according to the functions of the present invention. Thus, the terms may vary depending on user's or operator's intention and usage. Therefore, the terms used herein must be understood based on the descriptions made herein.

Figure 1:
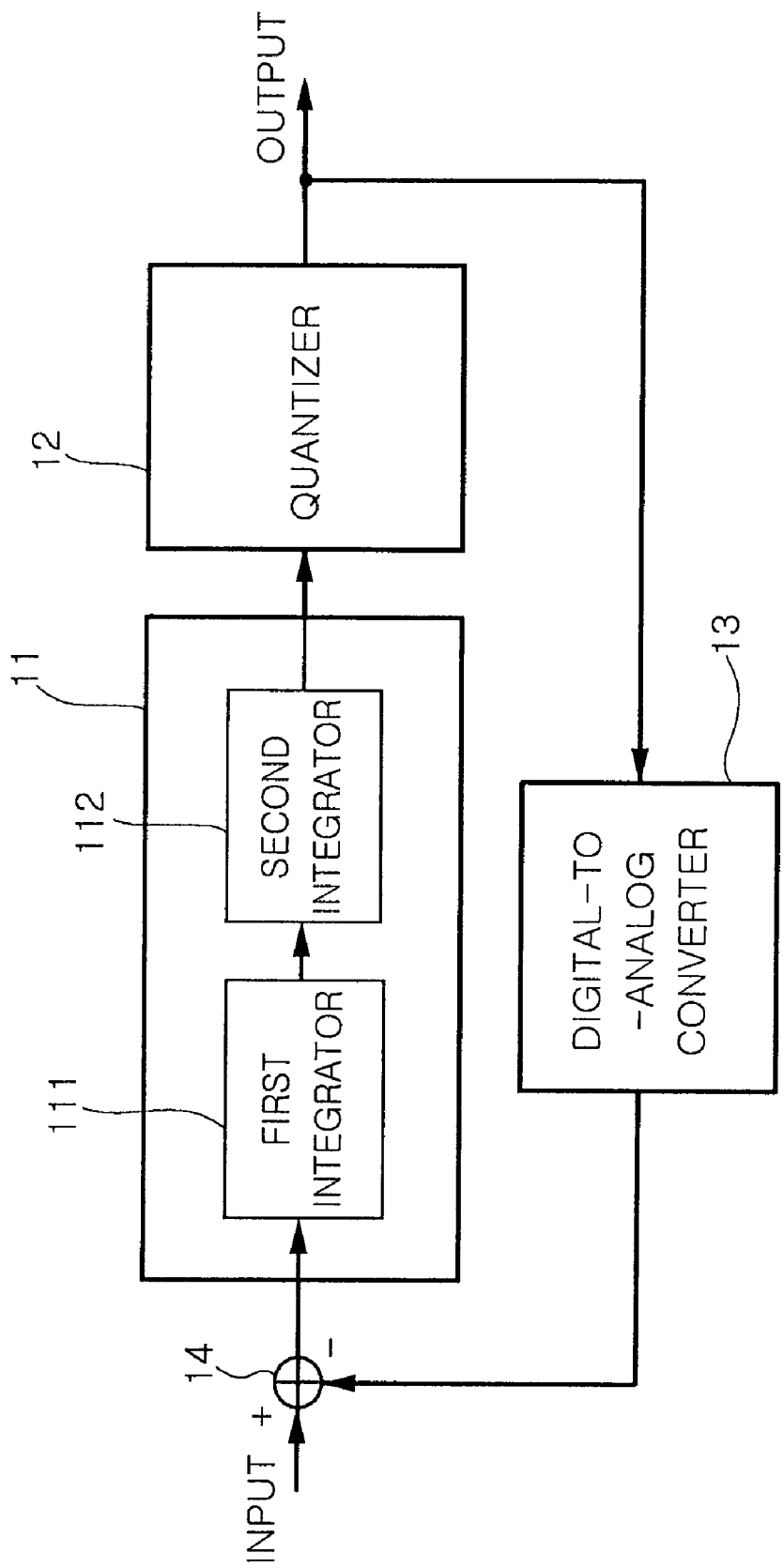
FIG. 1 is a block diagram of a typical sigma-delta modulator.

To begin with, an example of a typical sigma-delta modulator, to which the present invention is applicable, will be described below with reference to FIG. 1. FIG. 1 is a block diagram of a typical sigma-delta modulator. Referring to FIG. 1, the typical sigma-delta modulator includes a resonator 11, a quantizer 12, a digital-to-analog converter (DAC) 13, and an adder 14. The resonator 11 may include at least one of integrators 111 and 112 configured with an operational amplifier and a switched capacitor circuit.

In the sigma-delta modulator, the resonator 11 is a key element providing quantization noise shaping. The resonator 11 serves as a bandpass filter having a pass band around a resonance frequency. The resonator 11 should operate at high frequency and have high Q-value. An output of the resonator 11 is input to the quantizer 12, and the quantizer 12 can output 1-bit quantized output, e.g., "0 (LOW)" or "1 (HIGH)", depending on the intensity of the output of the resonator 11. The output of the quantizer 12 is fedback to the DAC 13, and an output of the DAC 13 is input to the adder 14. The adder 14 supplies the result of subtracting the output of the DAC 13 from an input signal to the resonator 11.

Figure 2:
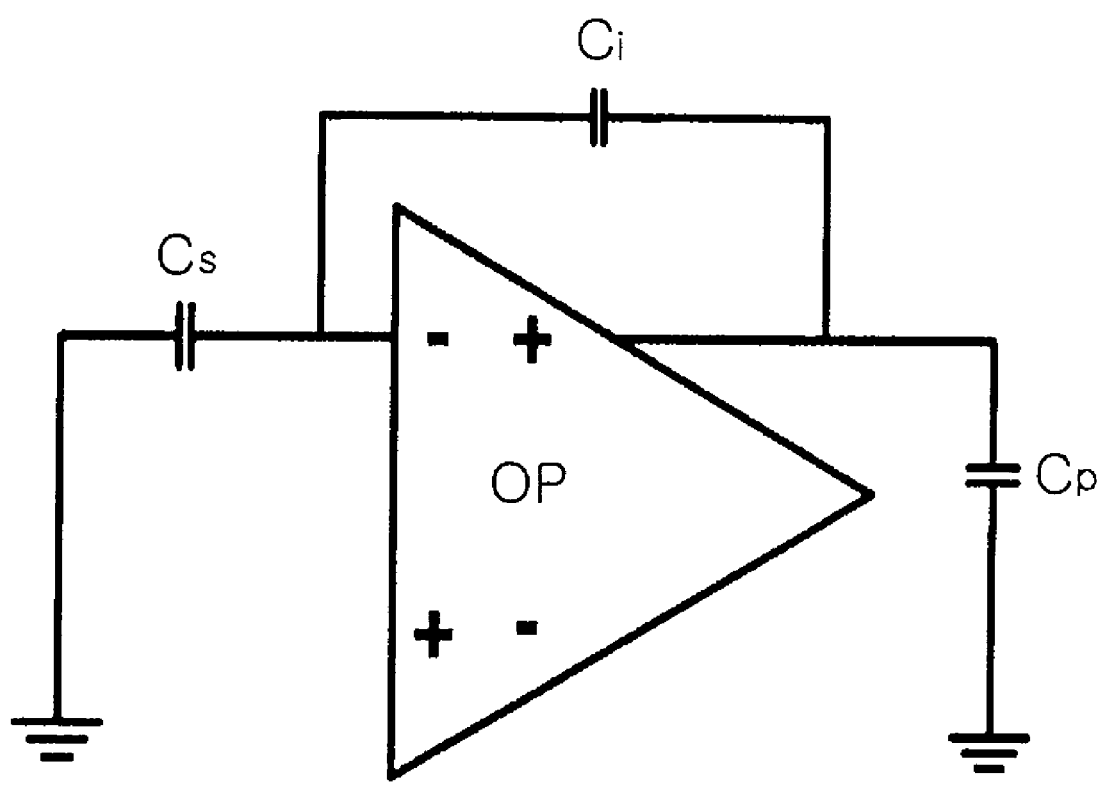
FIG. 2 is a circuit diagram illustrating a settling time constant of an integrator.

The resonator 11, particularly a switched capacitor resonator, may include at least one integrator configured with an operational amplifier and a switched capacitor circuit. FIG. 2 is a circuit diagram illustrating a settling time constant of the integrator having an operational amplifier, which is applied to the switched capacitor resonator. The operational amplifier OP in FIG. 2 is a differential operational amplifier (DOA) having differential input-differential output. Although not shown in FIG. 2, capacitors connected in the same configuration of FIG. 2 may also be inserted between a non-inverting input terminal and an inverting output terminal. In this case, the operational amplifier OP operates in the same manner as below description.

In FIG. 2, Cs represents a sampling capacitor of the integrator, Ci represents an integration capacitor of the integrator, and Cp represents a parasitic capacitor. Under conditions illustrated in FIG. 2, a settling time constant ($\tau$) can be calculated from Equations (1) through (3).

$$\tau = \frac{1}{\beta \omega} \quad (1)$$

$$\beta = \frac{Ci}{Cs + Ci} \quad (2)$$

$$\omega = \frac{g_m}{Cp + \frac{CsCi}{Cs + Ci}} \quad (3)$$

where $g_m$ is transconductance of the operational amplifier.

Figure 3:
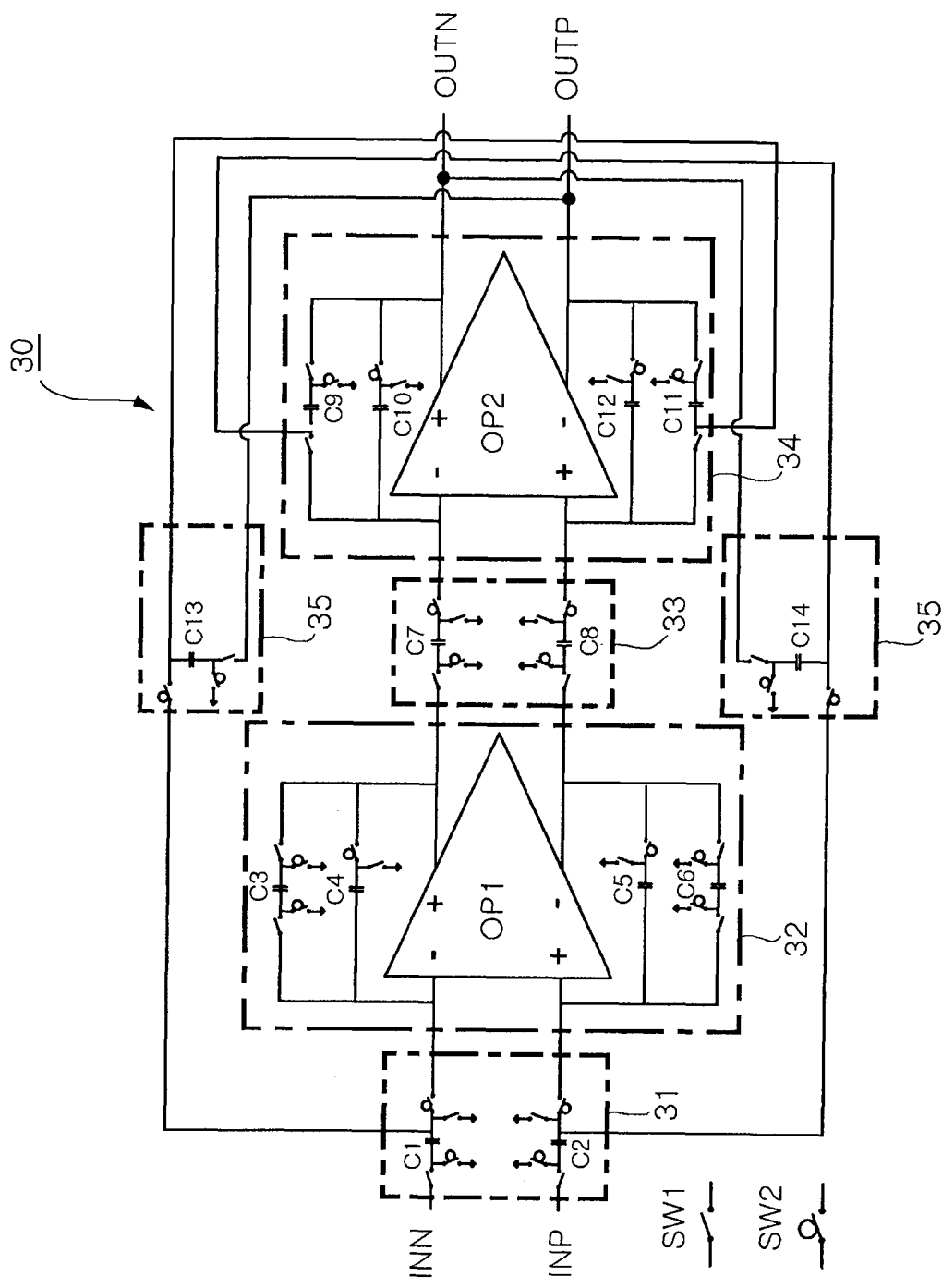
FIG. 3 is a circuit diagram illustrating a switched capacitor resonator according to an embodiment of the present invention.

FIG. 3 is a circuit diagram illustrating a switched capacitor resonator 30 according to an embodiment of the present invention.

Referring to FIG. 3, the switched capacitor resonator 30 may include main input terminals INN and INP, main output terminals OUTN and OUTP, a first signal input circuit 31, a first integrator circuit 32, a second signal input circuit 33, a second integrator circuit 34, and a main feedback circuits 35. Particularly, in this embodiment of the present invention, a sub feedback circuit of the second integrator circuit 24 and the main feedback circuit 35 are connected to each other so that capacitors of the main feedback circuit 35 are designed to serve as integration capacitors connected between input and output terminals of a second DOA OP2 in the second integrator circuit 34. Thus, a settling time of the second integrator circuit 34 is reduced by varying the integral capacitance of the second DOA OP2.

The main input terminals INN and INP and the main output terminals OUTN and OUTP are terminals through which all signals of the switched capacitor resonator 30 are input and output. Analog differential signals may be input through the main input terminals INN and INP, and analog differential signals filtered through the switched capacitor resonator 30 are output through the main output terminals OUTN and OUTP. The main input terminals INN and INP may be configured with two terminals through which two signals composing a differential signal are input, and, for example, may include a first main input terminal INN and a second main input terminal INP. Likewise, the main output terminals OUTN and OUTP may be configured with two terminals through which the two signals composing a differential signal are output, and, for example, may include a first main output terminal OUTN and a second main output terminal OUTP.

The first signal input circuit 31, which is connected to the main input terminals INN and INP, has a switched capacitor circuit including two kinds of switches and capacitors. Herein, the two kinds of switches are opened/shorted by switching clocks having a phase difference of 180° therebetween. Below-described switches operate by two kinds of switching clocks having first and second switching clocks, and the first and second switching clocks have a phase difference of 180° therebetween. In FIG. 3, symbol 'SW1' denotes a switch operating by the first switching clock, and symbol 'SW2' denotes a switch operating by the second switching clock. Also, reference numeral for each switch is omitted in FIG. 3 for conciseness. A position of a corresponding switch can be appreciated from a relation between elements having switches and a ground or capacitors connected thereto, and used switching clocks.

More specifically, the first signal input circuit 31 may include a first switched capacitor circuit connected between the first main input terminal INN and an inverting input terminal of a first DOA OP1 in the first integrator 32, and a second switched capacitor circuit connected between the second main input terminal INP and a non-inverting input terminal of the first DOA OP1 in the first integrator circuit 32.

The first switched capacitor circuit may include a first switch having one end connected to the first input terminal INN, a first capacitor C1 having one end connected to the other end of the first switch, a second switch having one end connected to the other end of the first capacitor C1 and the other end connected to the inverting input terminal of the first DOA OP1, a third switch connected between a ground and a connection node between the first capacitor C1 and the second switch, and a fourth switch connected between the ground and a connection node between the first switch and the first capacitor C1.

The second switched capacitor circuit may include a fifth switch having one end connected to the second input terminal INP, a second capacitor C2 having one end connected to the other end of the fifth switch, a sixth switch having one connected to the other end of the second capacitor C2 and the other end connected to the non-inverting input terminal of the first DOA OP1, a seventh switch connected between the ground and a connection node between the second capacitor C2 and the sixth switch, and an eighth switch connected between the ground and a connection node between the fifth switch and the second capacitor C2.

As illustrated in FIG. 3, the first, third, fifth and seventh switches may be switches SW1 opened/shorted by the first switching clock, whereas the second, fourth, sixth and eighth switches may be switches SW2 opened/shorted by the second switching clock having a phase difference of 180° from the first switching clock.

The first integrator circuit 32 may include the first DOA OP1 having an input terminal connected to the first signal input circuit 31, and a first sub feedback circuit connected between input and output terminals of the first DOA OP1 and having a switched capacitor circuit configuration.

The first sub feedback circuit may include a third switched capacitor circuit connected between the inverting input terminal and the non-inverting output terminal of the first DOA OP1, and a fourth switched capacitor circuit connected between the non-inverting input terminal and the inverting output terminal of the first differential operation amplifier OP1.

The third switched capacitor circuit may include a ninth switch having one end connected to the inverting input terminal of the first DOA OP1, a third capacitor C3 having one end connected to the other end of the ninth switch, a tenth switch having one end connected to the other end of the third capacitor C3 and the other end connected to the non-inverting output terminal of the first DOA OP1, an eleventh switch connected between the ground and a connection node between the ninth switch and the third capacitor C3, and a twelfth switch connected between the ground and a connection node between the third capacitor C3 and the tenth switch, a fourth capacitor C4 having one end connected to the inverting input terminal of the first DOA OP1, the thirteenth switch connected between the other end of the fourth capacitor C4 and the non-inverting output terminal of the first DOA OP1, and a fourteenth switch connected between the ground and a connection node between the fourth capacitor C4 and the thirteenth switch.

The fourth switch capacitor circuit may include a fifteenth switch having one end connected to the non-inverting input terminal of the first DOA OP1, a fifth capacitor C5 having one end connected to the other end of the fifteenth switch, a sixteenth switch having one end connected to the other end of the fifth capacitor C5 and the other end connected to the inverting output terminal of the first DOA OP1, a seventeenth switch connected between the ground and a connection node between the fifteenth switch and the fifth capacitor C5, and an eighteenth switch connected between the ground and a connection node between the fifth capacitor C5 and the sixteenth switch, a sixth capacitor C6 having one end connected to the non-inverting input terminal of the first DOA OP1, the nineteenth switch connected between the other end of the sixth capacitor C6 and the inverting output terminal of the first DOA OP1, and a twentieth switch connected between the ground and a connection node between the sixth capacitor C6 and the nineteenth switch.

As illustrated in FIG. 3, the ninth, tenth, fourteenth, fifteenth, sixteenth and twentieth switches may be switches SW1 opened/shorted by the first switching clock, whereas the eleventh, twelfth, thirteenth, seventeenth, eighteenth and nineteenth switches may be switches SW2 opened/shorted by the second switching clock having a phase difference of 180° from the first switching clock.

The second signal input circuit 33 is connected between the output terminal of the first DOA OP1 and the second differential amplifier OP2 of the second integrator circuit 34, and has the switched capacitor circuit configuration. The switched capacitor circuit of the second signal input circuit 33 may have switches and capacitors connected in a similar manner to those of the first signal input circuit 31. The second signal input circuit 33 may include a fifth switched capacitor circuit connected between the non-inverting output terminal of the first DOA OP1 and an inverting input terminal of the second DOA OP2, and a sixth switched capacitor circuit connected between the inverting output terminal of the first DOA OP1 and a non-inverting input terminal of the second DOA OP2.

The fifth switched capacitor circuit may include a twenty-first switch having one end connected to the non-inverting output terminal of the first DOA OP1, a seventh capacitor C7 having one end connected to the other end of the twenty-first switch, a twenty-second switch having one end connected to the other end of the seventh capacitor C7 and the other end connected to the inverting terminal of the second DOA OP2, a twenty-third switch connected between the ground and a connection node between the seventh capacitor C7 and the twenty-second switch, and a twenty-fourth switch connected between the ground and a connection node between the twenty-first switch and the seventh capacitor C7.

The sixth switched capacitor circuit may include a twenty-fifth switch having one end connected to the inverting output terminal of the first DOA OP1, an eighth capacitor C8 having one end connected to the other end of the twenty-fifth switch, a twenty-sixth switch having one end connected to the other end of the eighth capacitor C8 and the other end connected to the non-inverting input terminal of the second DOA OP2, a twenty-seventh switch connected between the ground and a connection node between the eighth capacitor C8 and the twenty-sixth switch, and a twenty-eighth switch connected between the ground and a connection node between the twenty-fifth switch and the eighth capacitor C8.

As illustrated in FIG. 3, the twenty-first, twenty-third, twenty-fifth and twenty-seventh switches may be switches SW1 opened/shorted by the first switching clock, whereas the twenty-second, twenty-fourth, twenty-sixth and twenty-eighth switches may be switches SW2 opened/shorted by the second switching clock having a phase difference of 180° from the first switching clock.

The second integrator circuit 34 may include the second DOA OP2 and a second sub feedback circuit. The second DOA OP2 includes an input terminal connected to the second signal input circuit 33 and an output terminal connected to the main output terminals OUTN and OUTP. The second sub feedback circuit is connected between the input and output terminals of the second DOA OP2, and has a switched capacitor circuit configuration. The second DOA OP2 may be the same as the first DOA OP1. The second sub feedback circuit of the second integrator circuit 34 may have capacitors and switches connected in a similar manner to those of the first sub feedback circuit. The second sub feedback circuit may be connected to the main feedback circuit.

The second sub feedback circuit may include a seventh switched capacitor circuit connected between the inverting input terminal and the non-inverting output terminal of the second DOA OP2, and an eighth switched capacitor circuit connected between the non-inverting input terminal and the inverting output terminal of the second DOA OP2.

The seventh switched capacitor circuit may include a twenty ninth switch having one end connected to the inverting input terminal of the second DOA OP2, a ninth capacitor C9 having one end connected to the other end of the twenty ninth switch, a thirtieth switch having one end connected to the other end of the ninth capacitor C9 and the other end connected to the non-inverting output terminal of the second DOA OP2, a tenth capacitor C10 having one end connected to the inverting input terminal of the second DOA OP2, the thirty-second switch connected between the other end of the tenth capacitor C10 and the non-inverting output terminal of the second DOA OP2, and a thirty-third switch connected between the ground and a connection node between the tenth capacitor C10 and the thirty-second switch.

The eighth switch capacitor circuit may include a thirty-fourth switch having one end connected to the inverting input terminal of the second DOA OP2, an eleventh capacitor C11 having one end connected to the other end of the thirty-fourth switch, a thirty-fifth switch having one end connected to the other end of the eleventh capacitor C11 and the other end connected to the inverting output terminal of the second DOA OP2, a thirty-sixth switch connected between the ground and a connection node between the thirty-fifth switch and the eleventh capacitor C11, a twelfth capacitor C12 having one end connected to the non-inverting input terminal of the second DOA OP2, the thirty-seventh switch connected between the other end of the twelfth capacitor C12 and the inverting output terminal of the second DOA OP2, and a thirty-eighth switch connected between the ground and a connection node between the twelfth capacitor C12 and the thirty-seventh switch.

As illustrated in FIG. 3, the twenty ninth, thirtieth, thirty-third, thirty-fourth, thirty-fifth and thirty-eighth switches may be switches SW1 opened/shorted by the first switching clock, whereas the thirty-first, thirty-second, thirty-sixth and thirty-seventh switches may be switches SW2 opened/shorted by the second switching clock having a phase difference of 180° from the first switching clock.

The main feedback circuit 35 is connected between the first signal input circuit 31 and the main output terminal, and has a switched capacitor circuit configuration. The main feedback circuit 35 may include a ninth switched capacitor circuit connected between the first switched capacitor circuit of the first signal input circuit 31 and the inverting output terminal of the second DOA OP2, and a tenth switched capacitor circuit connected between the second switched capacitor circuit of the first signal input circuit 31 and the non-inverting output terminal of the second DOA OP2. The ninth switched capacitor circuit may be connected to the eighth switched capacitor circuit of the second sub feedback circuit, and the tenth switched capacitor circuit may be connected to the seventh switched capacitor circuit of the second sub feedback circuit.

The ninth switched capacitor circuit may include a thirty-ninth switch having one end connected to a connection node between the first capacitor C1 and the second switch, a thirteenth capacitor C13 having one end connected to the other end of the thirty-ninth switch, a fortieth switch connected between the ground and the other end of the thirtieth capacitor C13, and a forty-first switch connected between the inverting output terminal of the second DOA OP2 and a connection node between the thirteenth capacitor C13 and the fortieth switch. The connection node between the thirty-ninth switch and the thirteenth capacitor C13 in the ninth switched capacitor circuit may be connected to the connection node between the eleventh capacitor C11 and the thirty-fourth switch in the eighth switched capacitor circuit.

The tenth switched capacitor circuit may include a forty-second switch having one end connected to a connection node between the second capacitor C2 and the sixth switch, a fourteenth capacitor C14 having one end connected to the other end of the forty-second switch, a forty-third switch connected between the ground and the other end of the fourteenth capacitor C14, and a forty-fourth switch connected between the non-inverting output terminal of the second DOA OP2 and a connection node between the fourteenth capacitor C14 and the forty-third switch. The connection node between the forty-second switch and the fourteenth capacitor C14 in the tenth switched capacitor circuit may be connected to the connection node between the ninth capacitor C9 and the twenty ninth switch in the seventh switched capacitor circuit.

In the switched capacitor resonator 30 having the above-described configuration, the first to ninth, eleventh, thirteenth and fourteenth capacitors C1 to C9, C11, C13 and C14 may have the same capacitance, and the tenth and twelfth capacitors C10 and C12 may have twice the capacitance of the first capacitor C1.

Herebelow, operation of the switched capacitor resonator will be described according to whether switches are opened/shorted by a switching clock.

Figure 4:
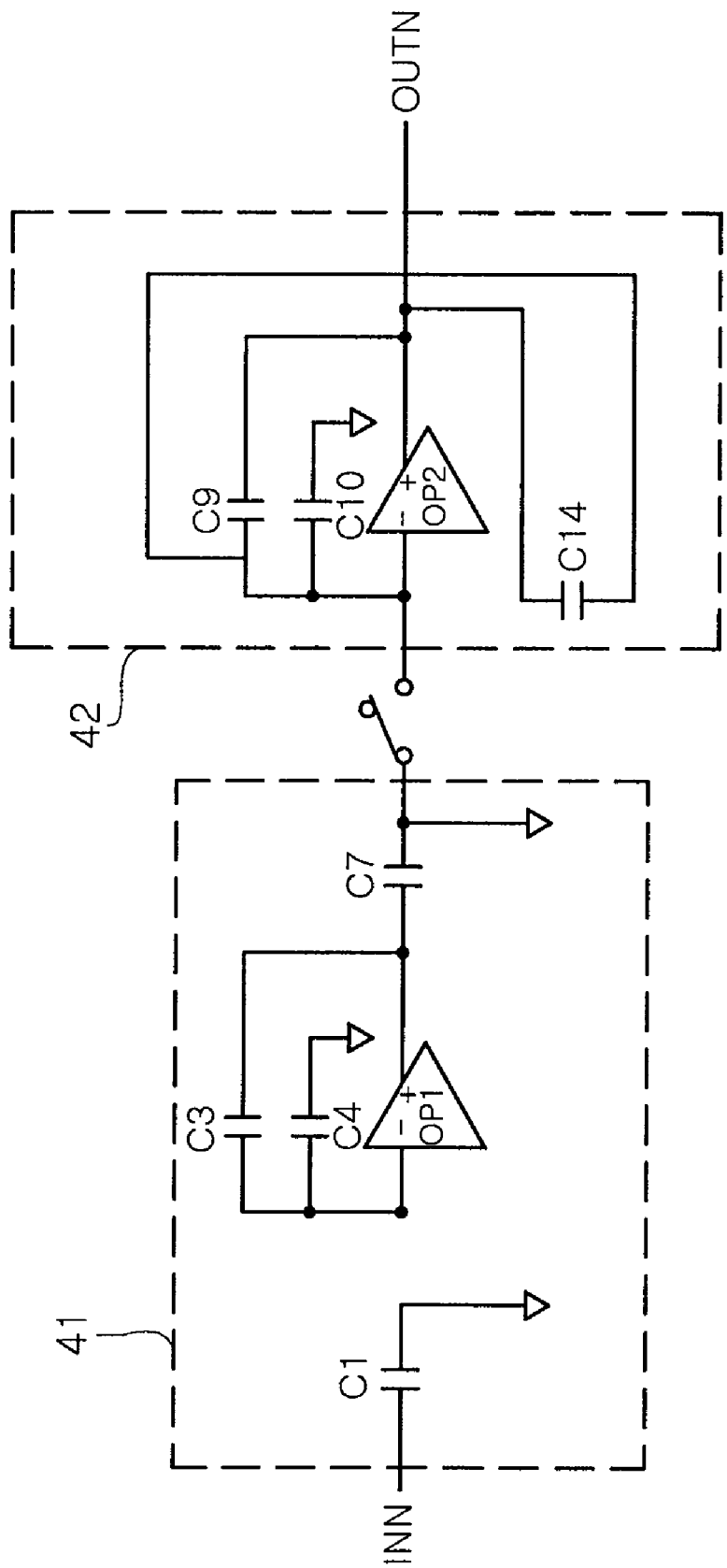
FIGS. 4 and 5 are circuit diagrams illustrating a circuit configuration of the switched capacitor resonator of FIG. 3 according to whether switches are opened or shorted.

FIG. 4 is a circuit diagram of the switched capacitor resonator according to the embodiment of FIG. 3, when the first switching clock is at HIGH level. Since the second switching clock has a phase difference of 180° from the first switching clock, the second switching clock is at LOW level. That is, FIG. 4 illustrates that the switches indicated by 'SW1' in FIG. 3 are shorted and switches indicated by 'SW2' in FIG. 3 are opened.

Referring to FIG. 4, according to a circuit 41 having the first DOA OP1 of the first integrator circuit 32, a fourth capacitor C4 is the sampling capacitor Cs of FIG. 2, the third capacitor C3 is the integration capacitor Ci of FIG. 2, and a seventh capacitor C7 is the capacitor connected in parallel with the parasitic capacitor Cp of FIG. 2. If the third, fourth and seventh capacitors C3, C4 and C7 have the same capacitance, a settling time constant ($\tau_1$) of the circuit 41 can be calculated from Equation (4) below when the first switching clock is at HIGH level.

$$\tau_1 = \frac{3Cu + 2Cp}{g_m} \quad (4)$$

where Cu represents the capacitance of the third, fourth and seventh capacitors C3, c4 and C7, Cp represents the parasitic capacitance of the first DOA OP1, $g_m$ represents the transconductance of the first DOA OP1.

As illustrated in FIG. 4, according to a circuit 42 having the second DOA OP2 of the second integrator circuit 34, the sub feedback circuit of the second integrator circuit 34 is connected to the main feedback circuit 35 so that the fourteenth capacitor C14 of the main feedback circuit 35 serves as the integration capacitor of the second DOA OP2. Therefore, the tenth capacitor C10 serves as the sampling capacitor Cs, and the ninth and fourteenth capacitors C9 and C14, which are connected in parallel, serve as the integration capacitor. A settling time constant ($\tau_2$) of the circuit 42 can be calculated from Equation (5) below. According to this embodiment of the present invention, the ninth and fourteenth capacitors C9 and C14 may have the same capacitance (Cu), and the tenth capacitor C10 may have twice (2Cu) the capacitance of the ninth capacitor C9.

$$\tau_2 = \frac{2Cu + 2Cp}{g_m} \quad (5)$$

where $g_m$ represents the transconductance of the second DOA OP2.

Herein, $g_m$ of Equation (5) is equal to $g_m$ of Equation (4) because the first and second DOAs OP1 and OP2 are identical to each other.

Figure 5:
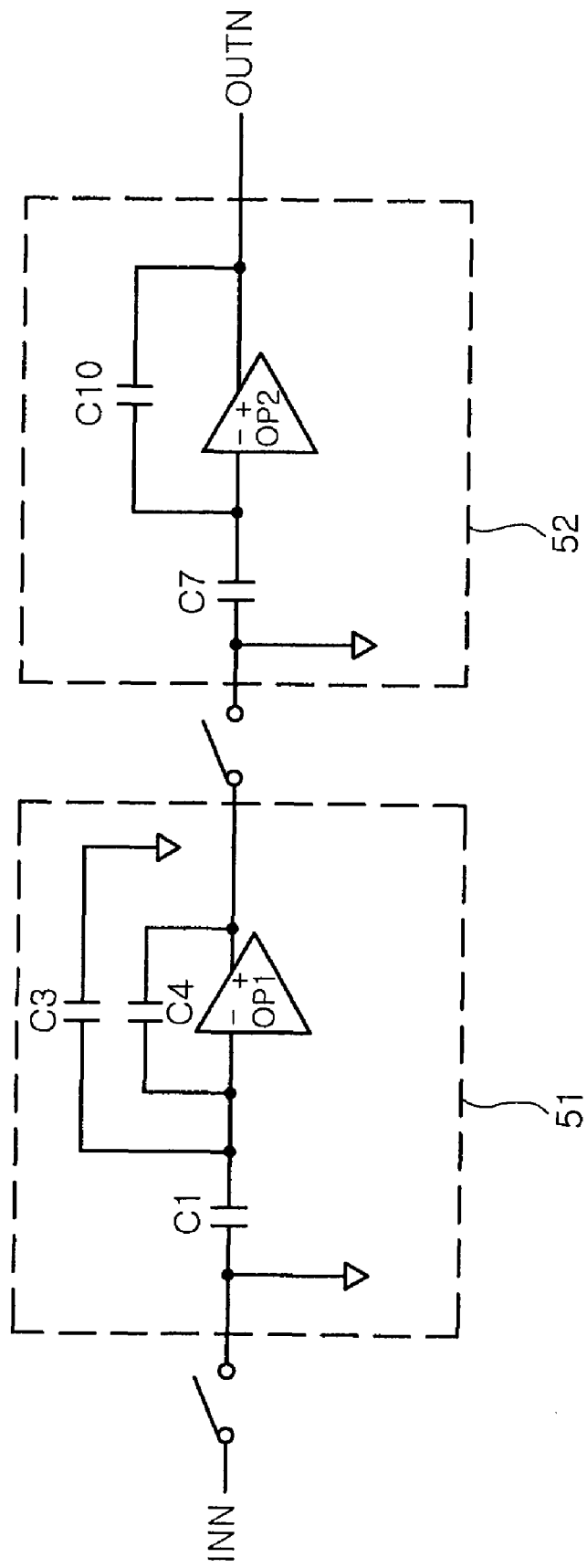

FIG. 5 is a circuit diagram of the switched capacitor resonator according to the embodiment of FIG. 3, when the second switching clock is at HIGH level. As described above, since the first switching clock has a phase difference of 180° from the second switching clock, the first switching clock is at LOW level. That is, FIG. 5 illustrates that the switches indicated by 'SW1' in FIG. 3 are opened and switches indicated by 'SW2' in FIG. 3 are shorted.

Similarly to the method of calculating the settling time constant from Equation (4), a settling time constant ($\tau_3$) of a circuit 51 can be calculated from Equation (6) below when the second switching clock is at HIGH level. According to this embodiment of the present invention, the first, fourth and thirteenth capacitors C1, C4 and C13 have the same capacitance (Cu).

$$\tau_3 = \frac{2Cu + 3Cp}{g_m} \quad (6)$$

Also, a settling time constant ($\tau_4$) of a circuit 52 can be calculated from Equation (7) below when the second switching clock is at HIGH level. According to this embodiment of the present invention, the capacitance of the seventh capacitor C7 is Cu, and the tenth capacitor C10 has twice (2Cu) the capacitance of the seventh capacitor C7.

$$\tau_4 = \frac{Cu + 1.5Cp}{g_m} \quad (7)$$

It can be observed that the settling time constant obtained according to whether switches are opened/shorted by the switching clocks is reduced in comparison with the settling time constant of a related art switched capacitor resonator.

Figure 6:
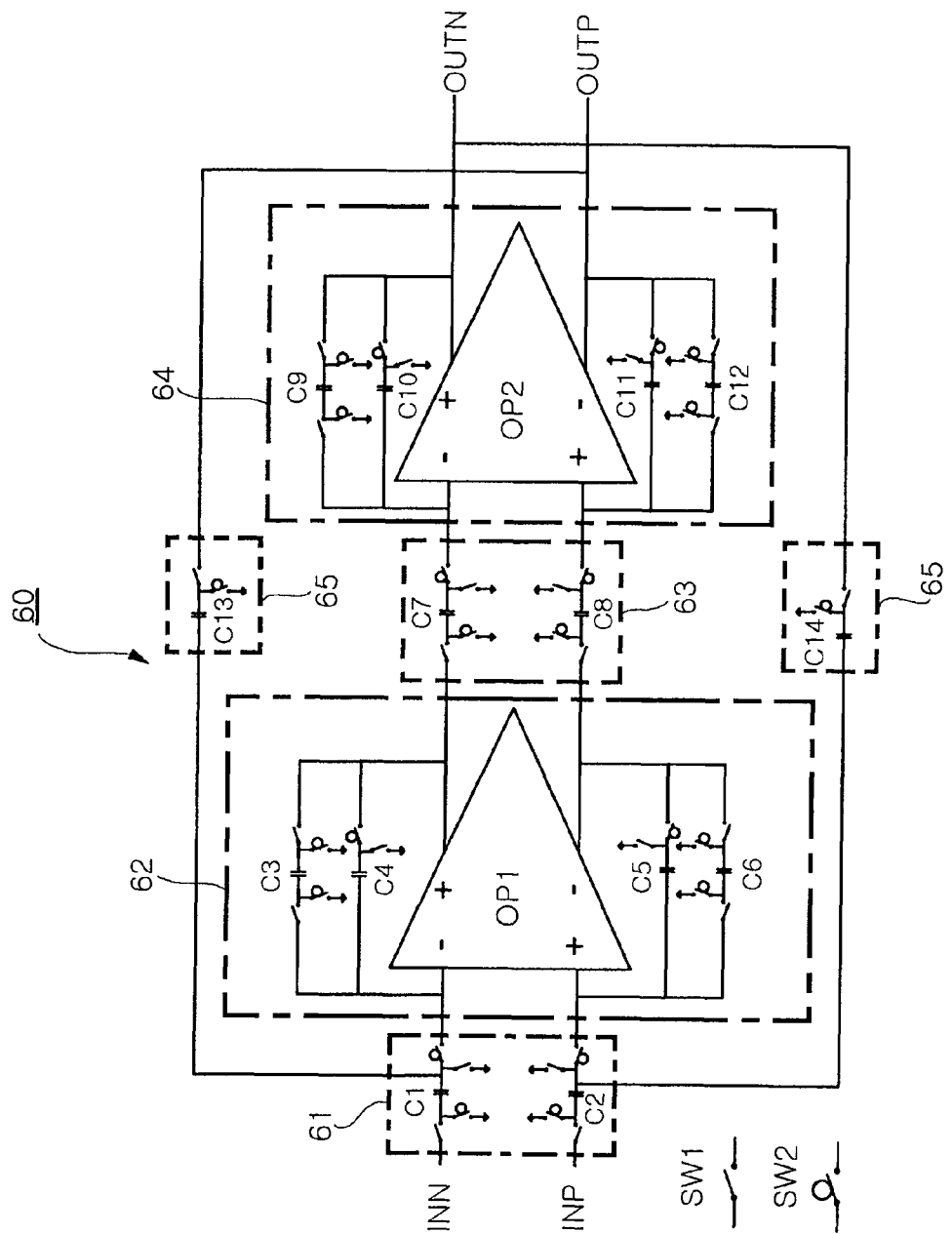
FIG. 6 is a circuit diagram of a related art switched capacitor resonator.

FIG. 6 is a circuit diagram of a related art switched capacitor resonator 60. The related art switched capacitor resonator 60 of FIG. 6 employs capacitors and switches as many as the switched capacitor resonator according to the embodiment of the present invention. It may be deemed that like reference numerals denote like elements in FIGS. 3 and 6. As illustrated in FIG. 6, a main feedback circuit 65 is not connected to the sub feedback circuit in the related art switched capacitor resonator 60.

Figure 7:
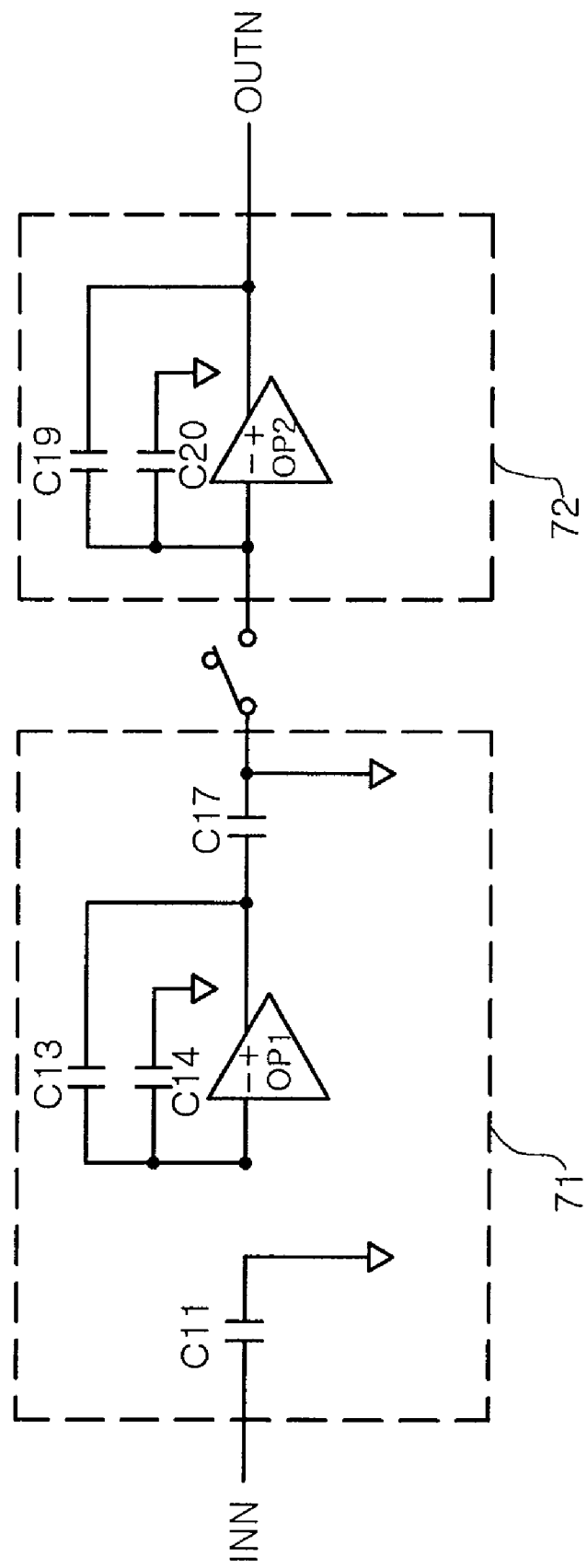
FIG. 7 is a circuit diagram illustrating a circuit configuration of the related art switched capacitor resonator of FIG. 6 according to whether switches are opened or shorted.

FIG. 7 is a circuit diagram of the related art switched capacitor resonator of FIG. 6, when the first switching clock is at HIGH level. Referring to FIG. 7, since the main feedback circuit is not connected to the sub feedback circuit, only the ninth capacitor C9 serves as an integration capacitor in a circuit 72 having the second DOA OP2. A circuit 71 having the first DOA OP1 is identical in configuration to the circuit 41 of FIG. 4. Therefore, a settling time constant ($\tau_5$) of the circuit 72 of the related art switched capacitor resonator can be calculated from Equation (8) below when the first switching clock is at HIGH level.

$$\tau_5 = \frac{5Cu + 3Cp}{g_m} \quad (8)$$

When comparing the settling time constant $\tau_5$ with the settling time constant $\tau_4$, it can be appreciated that numerator of $\tau_4$ is much smaller than that of $\tau_5$. That is, according to the present invention, it is possible to reduce the settling time constant compared to the related art switched capacitor resonator, thus improving an operating speed of the switched capacitor resonator.

Figure 8:
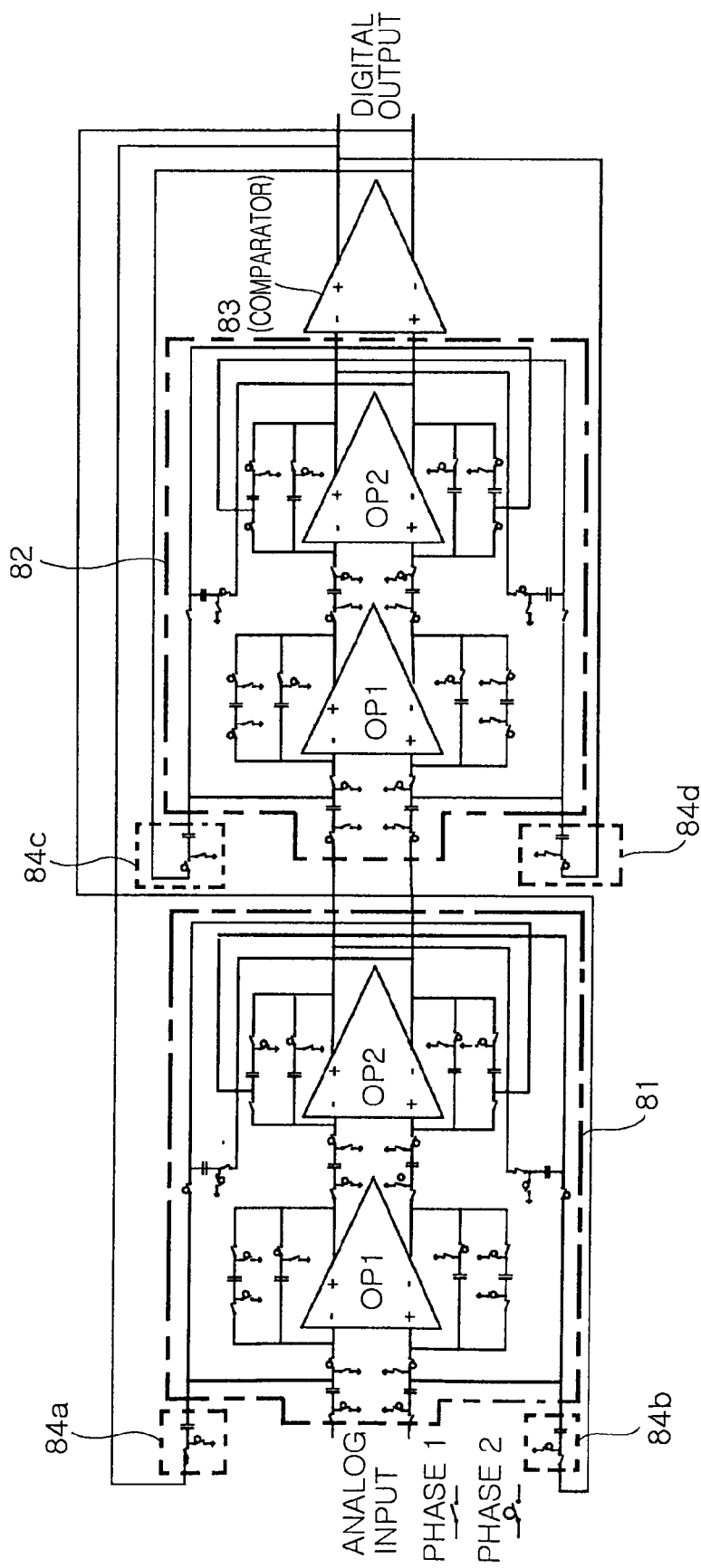
FIG. 8 is a sigma-delta modulator including the switched capacitor resonator of FIG. 3.

FIG. 8 is a sigma-delta modulator including the switched capacitor resonator according to the previous embodiment of FIG. 3. Specifically, FIG. 8 illustrates a sigma-delta modulator having a configuration illustrated in FIG. 1 using the switched capacitor resonator according to the embodiment of the present invention.

The sigma-delta modulator of FIG. 8 includes resonators 81 and 82 of the previous embodiment, a comparator 83, and a digital-to-analog converter (DAC) circuits 84a to 84d. The sigma-delta modulator of FIG. 8 is a fourth-order discrete-time bandpass sigma-delta modulator where the two resonators 81 and 82 each having two aforesaid integrators are connected in series. The comparator 83 used as a quantizer may be connected to an output terminal of the resonator 82. The comparator 83 performs 1-bit analog-to-digital converting function to indicate an input analog signal as 'HIGH' or 'LOW'. A digital output of the comparator 83 is fedback to the DAC circuits 83*a* to 83*d* that serve as a 1-bit analog-to-digital converter shorted/opened by switching clocks. The outputs of the DAC circuits 84*a* and 84*b* are subtracted from the input of the resonator 81, and the outputs of the DAC circuits 84*d* and 84*d* are subtracted from the input of the resonator 82.

According to the present invention, since the main feedback circuit of the switched capacitor resonator is connected to the sub feedback circuit of the integrator in the switched capacitor resonator, the capacitor included in the main feedback circuit serves as the integration capacitor of the operational amplifier of the integrator to thereby reduce the settling time constant of the integrator, thus making it possible to improve an operating speed of the switched capacitor resonator and an operating speed of the sigma-delta modulator including the switched capacitor resonator.

While the present invention has been shown and described in connection with the exemplary embodiments, it will be apparent to those skilled in the art that modifications and variations can be made without departing from the spirit and scope of the invention as defined by the appended claims.

What is claimed is:

1. A switched capacitor resonator, comprising:
   a main input terminal configured to receive an analog differential signal, and a main output terminal configured to output an analog differential signal;
   a first signal input circuit connected to the main input terminal, and having a switched capacitor circuit configuration configured with a capacitor and two kinds of switches configured to be opened/shorted by switching clocks having a phase different of 180° therebetween;
   a first integrator circuit comprising a first differential operational amplifier having an input terminal connected to the first signal input circuit, and a first sub feedback circuit having the switched capacitor circuit configuration, the first sub feedback circuit being connected between input and output terminals of the first differential operational amplifier;
   a second signal input circuit connected to the output terminal of the first differential operational amplifier, and having the switched capacitor circuit configuration;
   a second integrator circuit comprising a second differential operational amplifier having an input terminal connected to the second signal input circuit and an output terminal connected to the main output terminal, and a second sub feedback circuit having the switched capacitor circuit configuration, the second sub feedback circuit being connected between input and output terminals of the second differential operational amplifier; and
   a main feedback circuit connected between the first signal input circuit and the main output terminal, and having the switched capacitor circuit configuration,
   wherein the main feedback circuit has a capacitor including a first end and a second end; and
   wherein the first end is directly connected to the first signal input circuit and directly connected to the input terminal of the second differential operational amplifier through the switches, and the second end is directly connected to the main output terminal through the switches, whereby the capacitor of the main feedback circuit serves as an integration capacitor connected between the input and output terminals of the second differential operational amplifier according to whether the switches are shorted or opened.

2. The switched capacitor resonator of claim 1, wherein the main input terminal comprises first and second main input terminals through which two signals comprising the analog differential signal are input, respectively,
   the first signal input circuit comprising:
      a first switched capacitor circuit comprising a first switch having one end connected to the first main input terminal, a first capacitor having an one end connected to the other end of the first switch, a second switch having one end connected to the other end of the first capacitor and the other end connected to an inverting input terminal of the first differential operational amplifier, a third switch connected between a ground and a connection node between the first capacitor and the second switch, and a fourth switch connected between the ground and a connection node between the first switch and the first capacitor; and
      a second switched capacitor circuit comprising a fifth switch having one end connected to the second main input terminal, a second capacitor having an one end connected to the other end of the fifth switch, a sixth switch having one end connected to the other end of the second capacitor and the other end connected to a non-inverting input terminal of the first differential operational amplifier, a seventh switch connected between the ground and a connection node between the second capacitor and the sixth switch, and an eighth switch connected between the ground and a connection node between the fifth switch and the second capacitor,
   wherein the first, third, fifth, and seventh switches are shorted/opened by a first switching clock, and the second, fourth, sixth and eighth switches are shorted/opened by a second switching clock having a phase difference of 180° from the first switching clock.

3. The switched capacitor resonator of claim 2, wherein the first sub feedback circuit comprises:
   a third switched capacitor circuit comprising a ninth switch having one end connected to the inverting input terminal of the first differential operational amplifier, a third capacitor having one end connected to the other end of the ninth switch, a tenth switch having one end connected to the other end of the third capacitor and the other end connected to a non-inverting output terminal of the first differential amplifier, an eleventh switch connected between the ground and a connection node between the third capacitor and the ninth switch, a twelfth switch connected between the ground and a connection node between the third capacitor and the tenth switch, a fourth capacitor having one end connected to the inverting input terminal of the first differential operational amplifier, a thirteenth switch connected between the other end of the fourth capacitor and the non-inverting output terminal of the first differential operational amplifier, and a fourteenth switch connected between the ground and a connection node between the fourth capacitor and the thirteenth switch; and
   a fourth switched capacitor circuit comprising a fifteenth switch having one end connected to the non-inverting input terminal of the first differential operational amplifier, a fifth capacitor having one end connected to the other end of the fifteenth switch, a sixteenth switch having one end connected to the other end of the fifth capacitor and the other end connected to an inverting output terminal of the first differential amplifier, a seventeenth switch connected between the ground and a connection node between the fifteenth switch and the fifth capacitor, an eighteenth switch connected between the ground and a connection node between the fifth capacitor and the sixteenth switch, a sixth capacitor having one end connected to the non-inverting input terminal of the first differential operational amplifier, a nineteenth switch connected between the other end of the sixth capacitor and the inverting output terminal of the first differential operational amplifier, and a twentieth switch connected between the ground and a connection node between the sixth capacitor and the nineteenth switch, wherein the ninth, tenth, fourteenth, fifteenth, sixteenth and twentieth switches are shorted/opened by the first switching clock, and the eleventh, twelfth, thirteenth, seventeenth, eighteenth and nineteenth switches are shorted/opened by the second switching clock.

4. The switched capacitor resonator of claim 3, wherein the second signal input circuit comprises:

a fifth switched capacitor circuit comprising a twenty-first switch having one end connected to the non-inverting output terminal of the first differential operational amplifier, a seventh capacitor having one end connected to the other end of the twenty-first switch, a twenty-second switch having one end connected to the other end of the seventh capacitor and the other end connected to an inverting input terminal of the second differential amplifier, a twenty-third switch connected between the ground and a connection node between the seventh capacitor and the twenty-second switch, and a twenty-fourth switch connected between the ground and a connection node between the seventh capacitor and the twenty-first switch; and a sixth switched capacitor circuit comprising a twenty-fifth switch having one end connected to the inverting output terminal of the first differential operational amplifier, an eighth capacitor having one end connected to the other end of the twenty-fifth switch, a twenty-sixth switch having one end connected to the other end of the eighth capacitor and the other end connected to a non-inverting input terminal of the second differential amplifier, a twenty-seventh switch connected between the ground and a connection node between the eighth capacitor and the twenty-sixth switch, and a twenty-eighth switch connected between the ground and a connection node between the eighth capacitor and the twenty-fifth switch, wherein the twenty-first, twenty-third, twenty-fifth and twenty-seventh switches are shorted/opened by the first switching clock, and the twenty-second, twenty-fourth, twenty-sixth and twenty-eighth switches are shorted/opened by the second switching clock.

5. The switched capacitor resonator of claim 4, wherein the second sub feedback circuit comprises:

a seventh switched capacitor circuit comprising a twenty ninth switch having one end connected to the inverting input terminal of the second differential operational amplifier, a ninth capacitor having one end connected to the other end of the twenty ninth switch, a thirtieth switch having one end connected to the other end of the ninth capacitor and the other end connected to a non-inverting output terminal of the second differential amplifier, a thirty-first switch connected between the ground and a connection node between the ninth capacitor and the thirtieth switch, a tenth capacitor having one end connected to the inverting input terminal of the second differential operational amplifier, a thirty-second switch connected between the other end of the tenth capacitor and the non-inverting output terminal of the second differential operational amplifier, and a thirty-third switch connected between the ground and a connection node between the tenth capacitor and the thirty-second switch; and an eighth switched capacitor circuit comprising a thirty-fourth switch having one end connected to the non-inverting input terminal of the second differential operational amplifier, an eleventh capacitor having one end connected to the other end of the thirty-fourth switch, a thirty-fifth switch having one end connected to the other end of the eleventh capacitor and the other end connected to an inverting output terminal of the second differential amplifier, a thirty-sixth switch connected between the ground and a connection node between the thirty-fifth switch and the eleventh capacitor, a twelfth capacitor having one end connected to the non-inverting input terminal of the second differential operational amplifier, a thirty-seventh switch connected between the other end of the twelfth capacitor and the inverting output terminal of the second differential operational amplifier, and a thirty-eighth switch connected between the ground and a connection node between the twelfth capacitor and the thirty-seventh switch, wherein the twenty ninth, thirtieth, thirty-third, thirty-fourth, thirty-fifth and thirty-eighth switches are shorted/opened by the first switching clock, and the thirty-first, thirty-second, thirty-sixth and thirty-seventh switches are shorted/opened by the second switching clock.

6. The switched capacitor resonator of claim 5, wherein the main feedback circuit comprises:

a ninth switched capacitor comprising a thirty-ninth switch having one end connected to a connection node between the first capacitor and the second switch, a thirteenth capacitor having one end connected to the other end of the thirty-ninth switch, a fortieth switch connected between the other end of the thirteenth capacitor and the ground, and a forty-first switch connected between the inverting output terminal of the second differential operational amplifier and a connection node between the thirteenth capacitor and the fortieth switch, a connection node between the thirty-ninth switch and the thirteenth capacitor being connected to a connection node between the eleventh capacitor and the thirty-fourth switch; and a tenth switched capacitor comprising a forty-second switch having one end connected to a connection node between the second capacitor and the sixth switch, a fourteenth capacitor having one end connected to the other end of the forty-second switch, a forty-third switch connected between the other end of the fourteenth capacitor and the ground, and a forty-fourth switch connected between the non-inverting output terminal of the second differential operational amplifier and a connection node between the fourteenth capacitor and the forty-third switch, a connection node between the forty-second switch and the fourteenth capacitor being connected to a connection node between the ninth capacitor and the twenty ninth switch, wherein the forty-first and forty-fourth switches are shorted/opened by the first switching clock, and the thirty-ninth, fortieth, forty-second and forty-third switches are shorted/opened by the second switching clock.

7. The switched capacitor resonator of claim 6, wherein the first to ninth, eleventh, thirteenth and fourteenth capacitors have the same capacitance, and the tenth and twelfth capacitors have twice the capacitance of the first capacitor.

8. A sigma-delta modulator comprising at least one switched capacitor resonator of claim 1.

* * * * *